United States Patent [19]

Washizuka et al.

[11] Patent Number: 5,058,996

[45] Date of Patent: Oct. 22, 1991

[54] LIQUID CRYSTAL DISPLAY

[75] Inventors: Isamu Washizuka, Soraku; Yoshio Takeda, Nara, both of Japan

[73] Assignee: Sharp Kabushiki Kaisha, Osaka, Japan

[21] Appl. No.: 676,873

[22] Filed: Nov. 30, 1984

Related U.S. Application Data

[63] Continuation of Ser. No. 870,210, Jan. 17, 1979, Pat. No. 4,533,213, which is a continuation of Ser. No. 582,079, Sep. 3, 1975, abandoned.

[30] Foreign Application Priority Data

May 31, 1974 [JP] Japan .................................. 49-62088

[51] Int. Cl.[5] ............................................. G02F 1/133
[52] U.S. Cl. ..................................... 359/89; 340/765; 340/784; 359/84
[58] Field of Search ....................... 350/332, 336, 338; 340/765, 800, 802, 784

[56] References Cited

U.S. PATENT DOCUMENTS 3,877,017  4/1975  Kawakami et al. ................. 350/332
3,999,180  12/1976  Hickman ........................... 350/332

Primary Examiner—Bruce Y. Arnold
Assistant Examiner—Martin Lerner

[57] ABSTRACT

A liquid crystal display panel for displaying information of plural digits comprises transparent segment electrodes, reflection electrodes and a liquid crystal composition sandwiched therebetween. In a preferred form employing the typical seven-segment font, the transparent segment electrodes in the respective digit positions are divided into two groups. The reflection electrodes are continuously provided in common to the respective digit positions in such a manner that the reflection electrodes are provided even at the spaces positioned between adjacent digit positions and divided into four electrodes with the use of thin gaps provided longitudinally of the liquids crystal display panel. Both the respective two groups of the transparent electrodes and the respective four reflection electrodes are connected to receive selection signals for display.

29 Claims, 7 Drawing Sheets

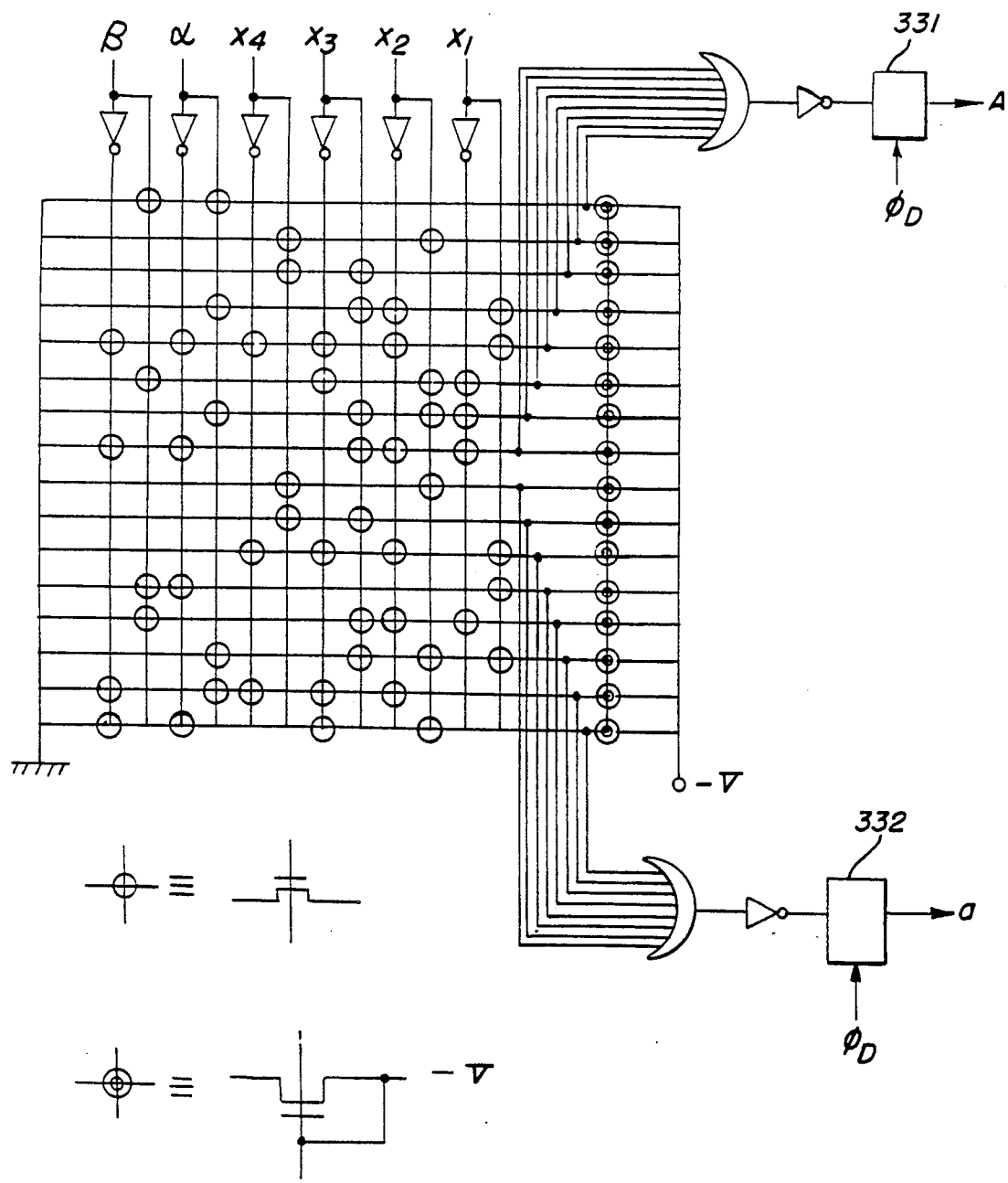
FIG. 4 (DECODER-33-)

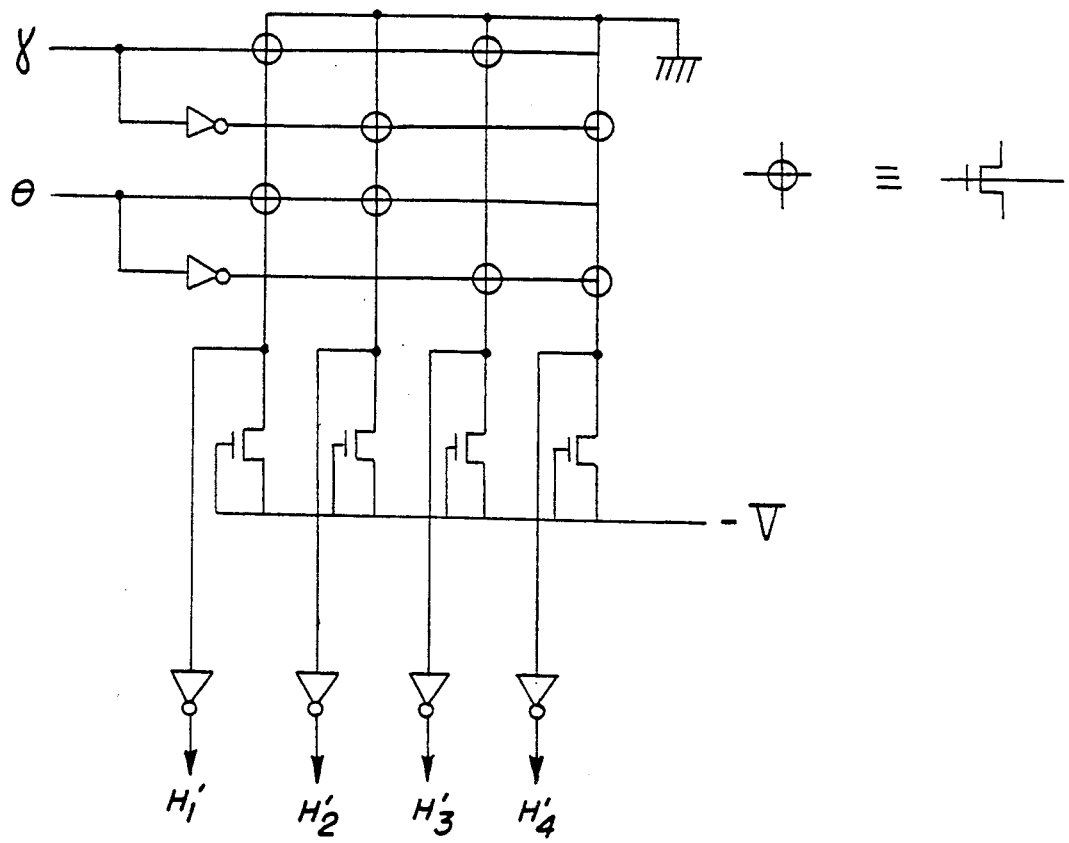
FIG. 6 (QUATERNARY COUNTER -34-)
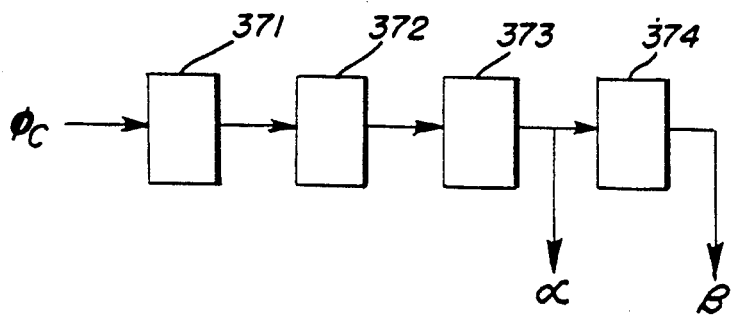
FIG. 5 (BINARY COUNTER -37-)

LIQUID CRYSTAL DISPLAY

This application is a continuation of copending application Ser. No.870,210 filed Jan. 17, 1979 now U.S. Pat. No. 4,533,213 issued Aug. 6, 1985, which is in turn a continuation of its copending application Ser. No. 582,079 filed Sept. 3, 1975, now abandoned.

BACKGROUND AND SUMMARY OF THE INVENTION

The present invention relates to a liquid cyrstal display panel for displaying numeral information of plural digits.

The liquid crystal display panel of the prior art comprised transparent segment electrodes, common reflection electrodes independently provided at the respective digit positions, and a liquid crystal composition sandwiched therebetween. The quality or contrast of display was not satisfactory since the spaces positioned between adjacent digit positions were not coated with the reflection electrodes. This was because the operator unavoidably recognized the character patterned or segment shaped reflection electrodes even at the positions being not selected for display.

Accordingly, an object of the present invention is to provide an improved liquid crystal display panel for displaying numeral information of plural digits.

Another object of the present invention is to provide a novel reflection electrode structure suitable for enhancing the display quality of the liquid crystal display panel.

Still another object of the present invention is to provide a novel driving system for the liquid crystal display panel.

Other objects and further scope of applicability of the present invention will become apparent from the detailed description given hereinafter.

It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objectives, pursuant to one embodiment of the present invention, the reflection electrodes are continuously provided in common to the respective digit positions in such a manner that the reflection electrodes are provided even at the spaces postioned between adjacent digit positions and divided into four electrodes with the use of thin gaps provided along the longitudinal edge of the liquid crystal display panel. The transparent segment electrodes in the respective digit positions are divided into two groups. Both the respective two groups of the transparent electrodes and the respective four reflection electrodes are connected to receive selection signals for display.

The visibility of the information displayed on the liquid crystal display panel can be enhanced in accordance with teachings of the present invention, since the reflection electrodes are provided even at the spaces positioned between the adjacent digit positions. The construction of the lead wires for the segment electrodes can be simplified since the segment electrodes are divided into two groups, respective of which are connected to receive selection signals in common.

BRIEF DISCRIPTION OF THE DRAWINGS

The present invention will become more fully understood from the detailed description given hereinbelow and the accompanying drawings which are given by way of illustration only, and thus are not limitative of the present invention and wherein, FIG. 1(A) is sectional view of a liquid crystal display panel of the prior art;

FIG. 4 is detailed circuit diagram of a decoder included in the driving circuit of FIG. 3;

FIG. 5 is a detailed circuit diagram binary counter included in the driving circuit of FIG. 3;

FIG. 6 is a detailed circuit diagram of a quaternary counter included in the driving circuit of FIG. 3.

DESCRIPTION OF THE PREFERRED EMBODIMENTS

The present invention will be described in conjunction with a dynamic-scattering mode liquid crystal display system, but the present invention is also applicable to a field-effect mode liquid crystal display system.

Referring now in detail to the drawings, and to facilitate a more complete understanding of the present invention, a liquid crystal display panel of the prior art will be first described with reference to FIGS. 1(A) through 1(C).

Figure 1B:
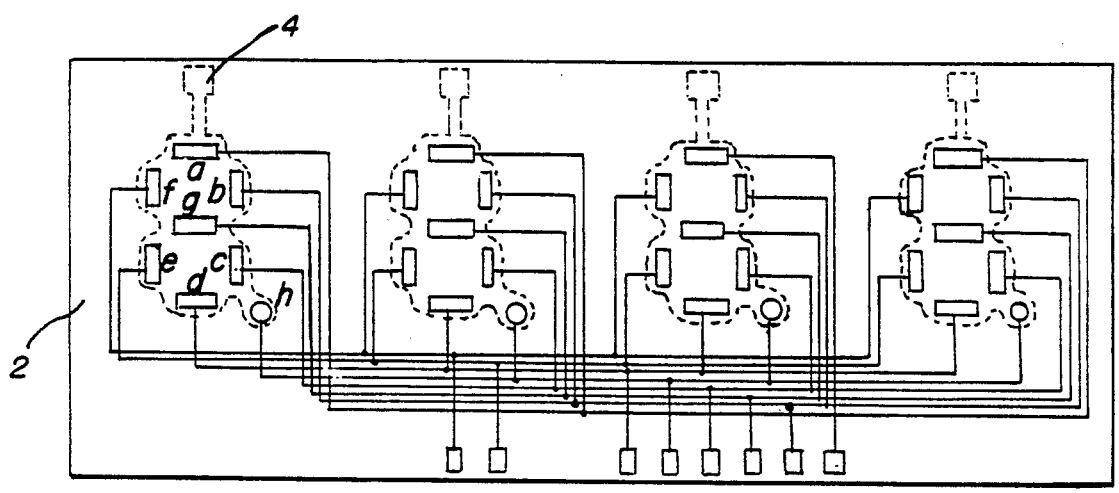
FIG. 1(B) is a plan view showing an example of a liquid crystal display panel of the prior art.
Figure 1C:
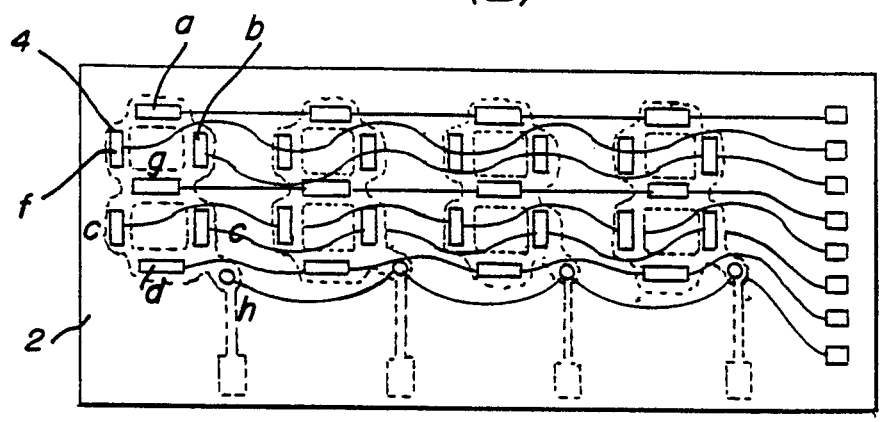
FIG. 1(C) is a plan view showing another example of a liquid crystal display panel of the prior art.
Figure 1A:
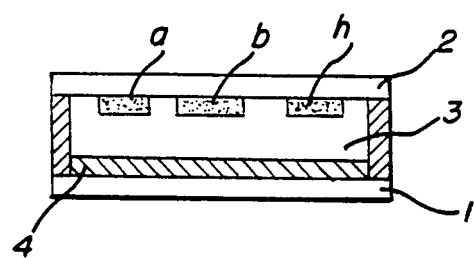

A liquid crystal display panel in general comprises a pair of glass substrata 1, 2 and a liquid crystal composition 3 sandwiched therebetween as shown in FIG. 1(A). A back plate electrode or a reflection electrode 4 made of suitable materials, for example, aluminum is provided on the inner surface of the glass substrate 1. Segment electrodes a, b, . . . , and h are provided on the inner surface of the other glass substrate 2. A predetermined voltage is supplied across the liquid crystal composition interposed beteen said both electrodes to display a desired character such as a numeral.

Referring now to FIG. 1(B), there is illustrated a typical liquid crystal display panel of the prior art comprising four digit positions, the segment electrodes a, b, c, d, e, f and g and a decimal point electrode h being provided on the substrate 2. The electrodes and the decimal point electrode are made of transparent and conductive material such as indium oxide and provided in quadruplet to correspond to the digit number.

The corresponding segment electrodes and the decimal point electrodes in the respective digit positions are connected in common to be led out from the interior of the display panel in order to receive selection signals. Reflection electrode 4 is provided in quadruplet on the other subtrate 1 to face the segment electrodes and the decimal point electrode in the respective digit positions. The four reflection electrodes are independent from each other.

In the above-mentioned liquid crystal display panel of the prior art, the multilayer wiring technology was unavoidably required to form such panel since the lead wires for the respective segment electrodes cross each other.

To dispense with the multilayer wiring, another liquid crystal display panel as shown in FIG. 1(C) was proposed. In this liquid crystal display panel the reflection electrodes 4 are segment shaped. Considerable spaces are required between the adjacent segment electrodes, though it is not preferable from the point of view of the visibility, since the lead wires must be provided through the spaces provided between the adjacent segment electrodes.

It will noted that the reflection electrodes of the liquid crystal display panel of the prior art were so constructed as to correspond to the respective segment electrodes or to correspond to the externals of the character pattern as shown by dotted lines in FIG. 1(B) and 1(C).

The attention of the operator is unavoidably placed on the character patterned or segment shaped reflection electrodes even at the positions being not selected for display in the liquid crystal display panel of the prior art. This results in that the quality or contrast of display is not satisfactory.

Figure 2A:
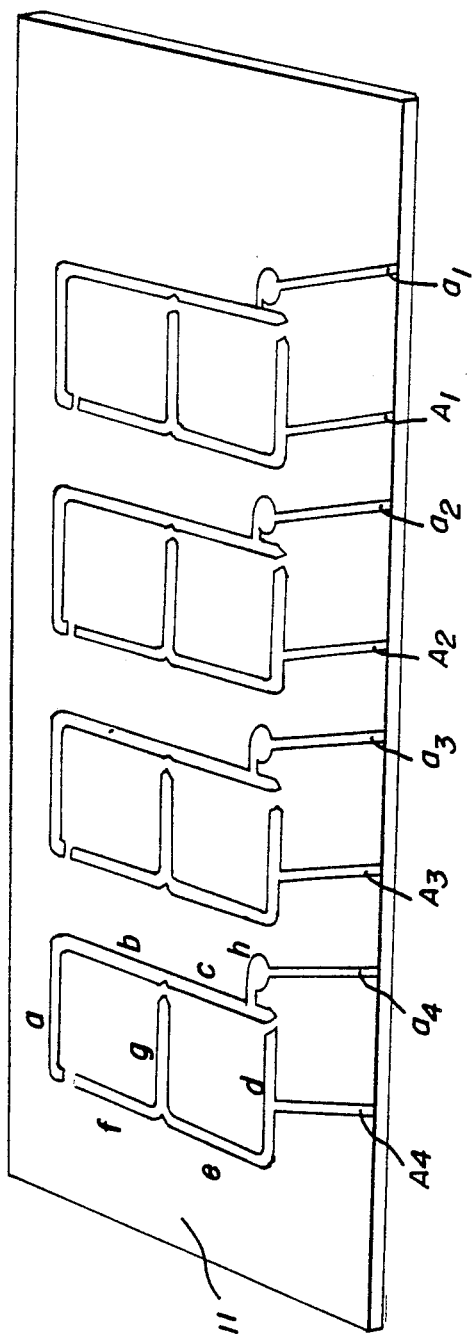
FIG. 2(A) is a plan view of a segment electrodes pattern of a liquid crystal display panel of the present invention.
Figure 2B:
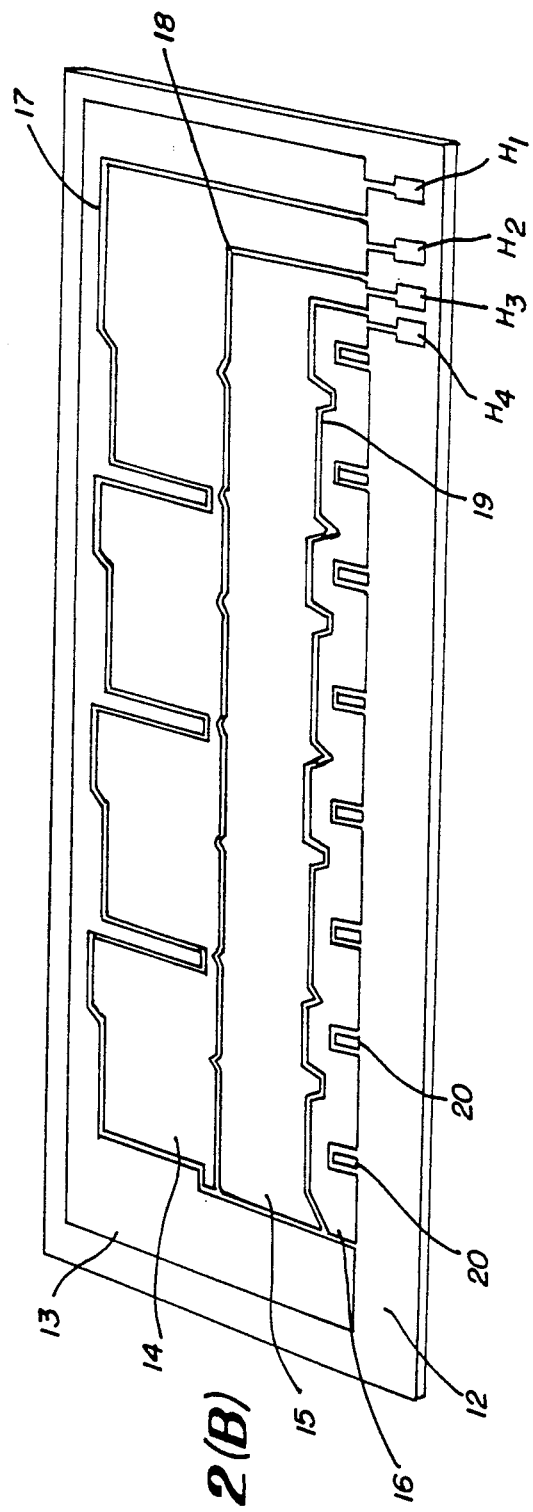
FIG. 2(B) is a plan view of a reflection electrodes pattern of a liquid crystal display panel of the present invention.
Figure 2C:
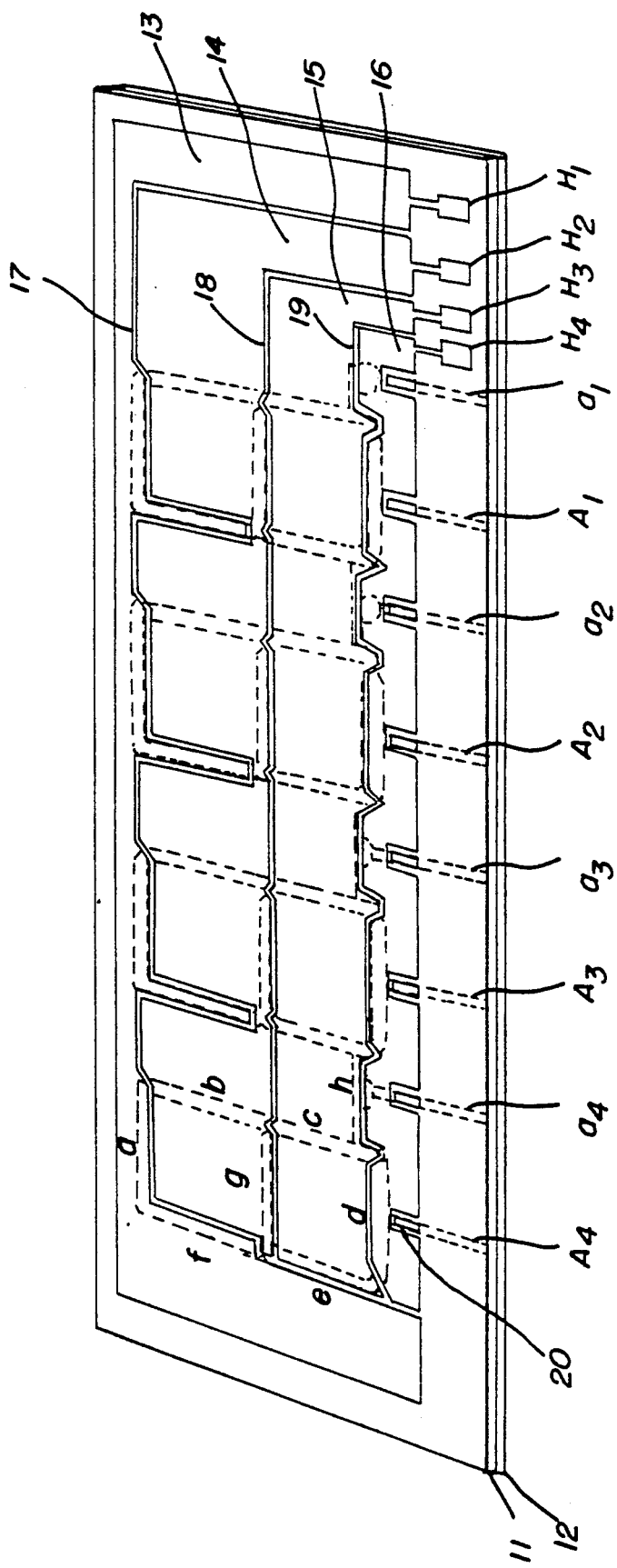
FIG. 2(C) is a plan view of a liquid crystal display panel of the present invention including the segment electrodes of FIG. 2(A) and the reflection electrodes of FIG. 2(B)

FIGS. 2(A), 2(B) and 2(C) show a segment electrodes pattern, a reflection electrodes pattern, and a liquid crystal display panel including the segment electrodes and the reflection electrodes of the present invention, respectively.

A plurality of segment electrodes a, b, c, . . . , and h made of a transparent metal film such as an indium oxide film are formed at the respective digit positions on the major surface of a glass substrate 11 as shown in FIG. 2(A) through the use of the evaporation technology or the photoetching technology. The segment electrodes in the respective digit positions are divided into two groups. The segment electrodes in the respective groups are connected with each other in common and the respective groups are connected to receive selection signals via terminals $a_1$-$a_4$ and $A_1$-$A_4$. The driving system of the liquid crystal display panel of the present invention will be described later with reference to FIGS. 3 through 7.

Plural reflection electrodes or back plate electrodes 13, 14, 15 and 16 made of, for example, alumimum are formed on the major surface of a back plate substrate 12 as shown in FIG. 2(B) through the use of the evaporation technology. The reflection electrodes 13, 14, 15 and 16 are continuously provided in common to the respective digit positions in such a manner that the reflection electrodes are provided even at the spaces positioned between adjacent digit positions or among the segment electrodes in the respective digit positions.

The reflection electrodes 13, 14, 15 and 16 are separated from each other by thin gaps 17, 18 and 19, which are formed by peeling off the metal film made of aluminum in a slit like fashion through the use of the photoetching technology or the printetching technology. It will be clear from FIG. 2(B) that the thin gaps 17, 18 and 19 are formed longitudinally of the liquid crystal display panel, thereby to continuously provide the reflection electrodes 13, 14, 15 and 16 in common to the respective digit positions. The width of the thin gaps is preferably selected narrower than one hundred and several tens microns.

The segment electrodes a, b, c and h in the respective four digit positions are connected with each other in common to receive selection signals through the terminals $a_1$, $a_2$, $a_3$ and $a_4$ of the respective digit positions. The remaining segment electrodes d, e, f and g are also commonly connected with each other to receive selection signals applied to the respective terminals $A_1$, $A_2$, $A_3$ and $A_4$ which are provided for the respective digit positions. It is not to say that the terminals $a_1$-$a_4$ and $A_1$-$A_4$ are also made of the transparent metal film such as the indium oxide film.

The reflection electrodes on the back plate substrate 12 are formed in the following manner: A first reflection electrode 13 faces the segment electrodes a and f in the respective digit positions and is connected to receive a selection signal via a first terminal $H_1$. A second reflection electrode 14 faces the segment electrodes b and g in the respective digit positions and is connected with a second terminal $H_2$. A third reflection electrode 15 faces the segment electrodes c and e in the four digit positions and is connected with a third terminal $H_3$, whereas a fourth reflection electrode 16 faces the segment electrodes d and h and is connected to receive a selection signal through a fourth terminal $H_4$.

The reflection electrodes 13, 14, 15 and 16 are continuously provided in common to the respective digit positions, as already discussed above, ands spaced away from each other by the thin gaps 17, 18 and 19. The operator can hardly recognize the thin gaps and, therefore, the reflection electrodes cover practically the whole surface of the back plate substrate 12.

The glass substrate 11 having the segment electrodes formed thereon and the back plate substrate 12 having the four reflection electrodes formed thereon are spaced away from each other and the liquid crystal composition is filled therebetween to form the liquid crystal display panel as shown in FIG. 2(C). Reflection plates 20 made of aluminum are provided on the back plate substrate 12 at the positions to correspond to the terminals $a_1$-$a_4$ and $A_1$-$A_4$. The reflection plates 20 are electrically isolated from the reflection electrodes. With such an arragement, the reflection system is positioned uniformly throughout the whole of the display panel.

The liquid crystal display panel of the present invention is available for enhancing the visibility since the reflection plate is uniformly provided throughout the display panel. Moreover, the lead wires for the segment electrodes can be simply fabricated as shown in FIG. 2(A).

When the segment a in the first digit position is desired to be selected for display, the terminal $a_1$ for the segment electrodes a, b, c and h in the first digit and the first terminal $H_1$ for the first reflection electrode 13 are operably selected to receive the selection signals for display.

Figure 3:
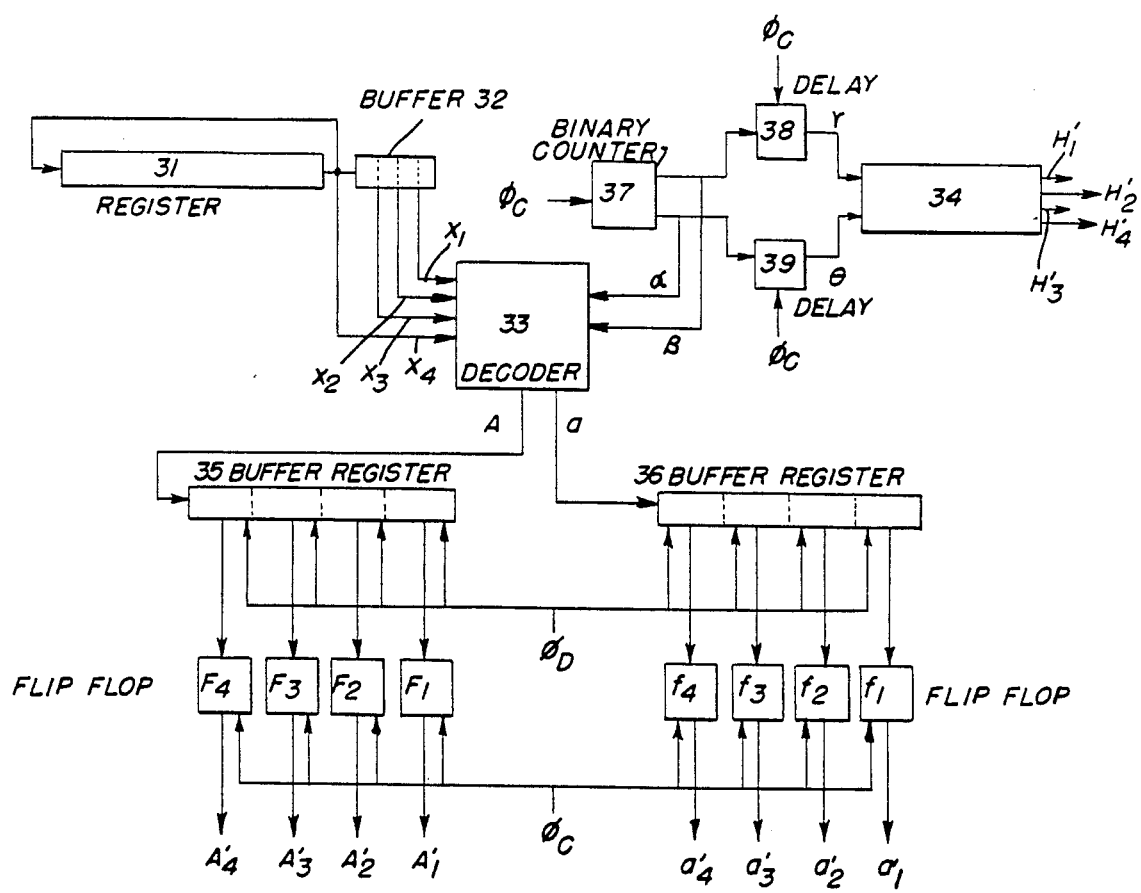
FIG. 3 is a schematic circuit diagram of a typical driving circuit for the liquid crystal display panel of the present ivnvention.

A typical circuit construction suitable for driving liquid crystal display panel of the present invention is shown in FIG. 3.

Numeral information stored in a display register 31 is introduced into a decoder 33 through a four bits buffer 32. Buffer registers 35 and 36 comprise plural digit storages the number of which corresponds to that of the display register 31. The contents stored in the respective digit storages of the buffer registers 35 and 36 are stored during one word period of time in flip-flops $F_1$-$F_4$ and $f_1$-$f_4$. A quaternary counter 34 provides selection signals to be applied to the reflection electrodes. The decoder 33 and the quaternary counter 34 are adapted to receive timing signals from a binary counter 37. Delay circuits 38 and 39 function to delay the selection signals to be applied to the reflection electrodes for one word period since the information stored in the register 31 is applied to the segment electrodes with one word delay via the buffer registers 35 and 36, whereby the reflection electrode selection signals are synchronized with the segment electrode selection signals.

A first clock signal $\phi_D$ occurs once every one digit period, whereas a second clock signal $\phi_C$ occurs once every one word period. Segment electrode selection signals $A_1'$-$A_4'$ and $a_1'$-$a_4'$ are derived from the flip-flops $F_1$-$F_4$ and $f_1$-$f_4$, and applied to the terminals $A_1$-$A_4$ and $a_1$-$a_4$, respectively. Reflection electrode selection signals $H_1'$-$H_4'$ are applied from the quaternary counter 34 to the terminals $H_1$-$H_4$.

Numeral statement stored in the register 31 is decoded into the segment selection control signals A and a by the decoder 33. A typical circuit construction of the decoder 33 is shown in FIG. 4. The decoder 33 is connected to receive timing signals $\alpha$ and $\beta$ from the binary counter 37 and information signals $X_1$, Xhd 2, $X_3$ and $X_4$ from the register 31 via the four bits buffer 32. The decoder 33 comprises a matrix shaped decoder made of MOS transistors. The segment selection control signals A and a are derived from D-type flip flops 331 and 332, which are controlled by the first clock signal $\phi_D$.

The segment selection control signals A and a correspond to the segment selection signals for the segments a and f during the time period when the first reflection electrode selection signal $H_1'$ appears. The segment selection control signals A and a correspond to the segment selection signals for the segments g and b, c and e, and d and h during the time period when the second reflection electrode selection signal $H_2'$ is generated, when the third reflection electrode selection signal $H_3'$ is generated, and when the fourth reflection electrode selection silgnal $H_4'$ is generated, respectively.

The above-mentioned segment selection control signals A and a are stored in the buffer registers 35 and 36, respectively. The contents of the buffer registers 35 and 36 are converted into the segment selection signals $A_1'$-$A_4'$ and $a_1'$-$a_4'$ having the pulse width of one word period via the flip-flops $F_1$-$F_4$ and $f_1$-$f_4$.

A typical circuit construction of the binary counter 37 is shown in FIG. 5. The binary counter 37 comprises a first T-type flip-flop 371, a second T-type flip-flop 372, a third T-type flip-flop 373, and a fourth T-type flip-flop 374. The first T-type flip-flop 371 receives the second clock singnal $\phi_C$. The third T-type flip-flop 373 provides the timing signal $\alpha$, whereas the fourth T-type flip-flop 374 provides the timing signals $\beta$. These signals can be fully understood when considered in conjunction with the FIG. 7 time chart.

The quaternary counter 34 can be typically constructed as shown in FIG. 6. The quaternary counter 34 comprises a matrix array made of MOS transistors and is connected to receive control signals $\gamma$ and $\theta$ which are delayed signals of the timing signals $\alpha$ and $\beta$. The quaternary counter 34 provides the reflection electrode signals $H_1'$, $H_2'$, $H_3'$ and $H_4'$ to be applied to the reflection electrodes.

Figure 7:
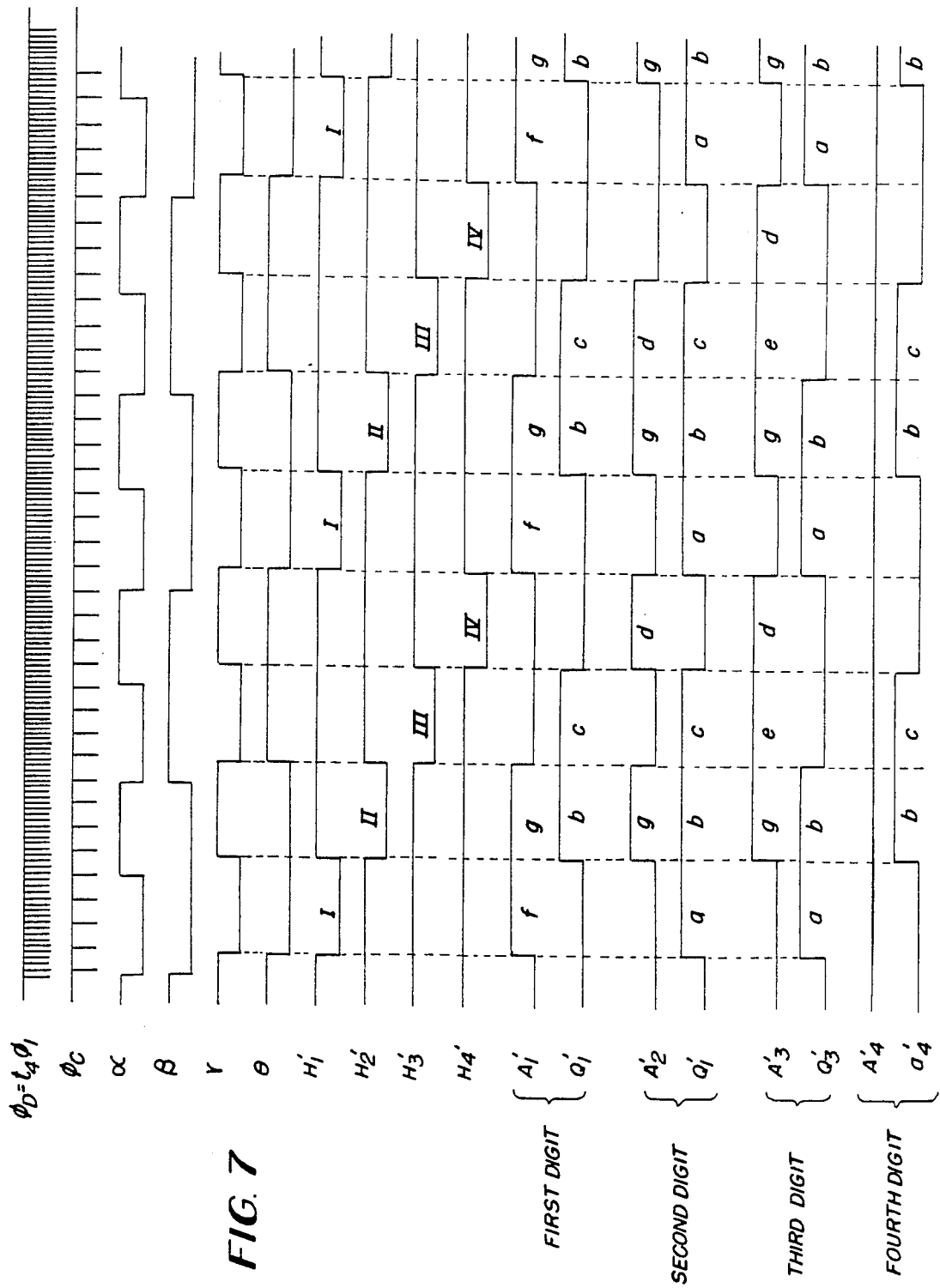
FIG. 7 is a time chart for the purpose of explanation of the driving circuit of FIG. 3.

An operation mode for displaying numeral information "1 2 3 4" will be described with reference to the FIG. 7 time chart.

Coded information "0 1 0 0", "0 0 1 1", "0 0 1 0" and "0 0 0 1" corresponding to the numeral information "4", "3","2" and "1" is introduced into the four bit buffer 32 at every provision of the first clock signal $\phi_D$, which is identical whith a timing signal $t_4\phi_1$. At this time the information is converted into the segment electrode selection control signals A and a by the decoder 33, the segment electrode selection control signals A and a being synchronized with the binary timing signals $\alpha$ and $\beta$. Thereafter, the reflection electrode selection signals $A_1'$-$A_4'$ and $a_1'$-$a_4'$ are derived from the flip-flops $F_1$-$F_4$ and $f_1$-$f_4$ via the buffer registers 35 and 36.

During the time period I when the reflection electrode selection signal $H_1'$ appears, $A_1'=1$, $a_1'=0$, $A_2'=0$, $a_2'=1$, $A_3'=0$, $a_3'=1$, $A_4=0$ and $a_4'=0$. The segment f in the first digit position, and the segment a in the second and third digit position are selected for display purpose.

During the time period II when the reflection electrode selection signal $H_2'$ is generated, $A_1'=1$, $a_1'=1$, $A_2'=1$, $a_2'=1$, $A_3'=1$, $a_3'=1$, $A_4'=0$ and $a_4'=1$. Therefore, the segment electrodes g and b in the first, second and third digit positions are selected for display, whereas the segment electrode b in the fourth digit position is selected.

- During the time period III when the reflection electrode selection signal $H_3'$ appears, $A_1'=0$, $a_1'=1$, $A_2'=0$, $a_2'=1$, $A_3'=1$, $a_3'=0$, $A_4'=0$ and $a_4'=1$. Therefore, the segment electrode c in the first, second and fourth digit positions are selected for display, whereas the segment electrode e in the third digit position is selected for display purpose.

During the time perieod IV when the reflection electrode selection signal $H_4'$ is generated, $A_1'=0$, $a_1'=0$, $A_2'=1$, $a_2'=0$, $A_3'=1$, $a_3'=0$, $A_4'=0$ and $a_4'=0$. Only the segment electrode d in the second and third digit positions are selected for display purpose.

The above-mentioned display cycle is repeated for maintaining the display condition.

In the above-mentioned embodiment both of the reflection electrode selection signals and the segment electrode selection signals are of the one polarity. The signals can be of the alternating polarities in order to ensure the long operating life of the liquid crystal composition. A driving circuit available for generating the selection signals in an alternating fashion can be easily implemented by the man skilled in the art when considered in conjunction with the above-mentioned embodiments.

An additional flat reflector mirror is preferably provided at the the back of the reflection electrodes or the back plate electrodes of the present invention to enhance the visibility. In this case the back plate electrodes can be transparent.

The invention being thus described, it will be obvious that the same way be varied in many ways. Such variations are not to be regarded as a departure from the spirit and scope of the invention, and all such modifications are intended to be included within the scope of the following claims.

What is claimed is:

1. A plural digit liquid crystal display device comprising:

a plural digit liquid crystal display panel inlcuding a liquid crystal;

a plurality of first electrode groups disposed on one side of said display panel, each of said first electrode groups corresponding to and at least partially defining a respective digit of said plural digit display device and each of said first electrode groups including a plurality of segment electrodes;

a plurality of second electrode groups disposed on the side of the display panel opposite to the side on which said first electrode group is disposed, each of said second electrode groups corresponding to and at least partially defining a respective digit of said plural digit display device and each of said electrode groups including a plurality of segmental electrode portions;

said electrodes of said first electrodes groups being in exact correspondence with said electrode portions of said second electrode groups;

each of said first electrode groups being grouped into a plurality of said first sub-groups of segment electrodes, said segment electrodes of said first sub-group of segment electrodes being commonly connected together;

each of said second electrode groups being grouped into a plurality of second sub-groups of segmental electrode portions which are different in configuration from said first sub-groups of segment electrodes, said segmental electrode portions of each second sub-group of segmental electrode portions being commonly connected together and corresponding second sub-groups of electrode portions of each of said second electrode groups foe each digit being commonly connected together;

means for sequentially applying phase-shifted drive signals of a predetermined cycle to the respective commonly connected segmental electrode portion sub-groups of said second electrode groups; and means for applying segment drive signals, corresponding to data to be displayed, simultaneously to a selected segment electrpde sub-group of selected ones of said first electrode groups in synchronisim with and concurrently with said application of a respective phase-shifted drive signal to effect a data display.

2. A plural digit liquid crystal display device according to claim 1, wherein said liquid crystal display panel comprises first terminals respectively coupled to said plurality of first sub-groups of segment electrodes of said first electrode groups for connection thereto of said segment drives; and a plurality of second terminals respectively coupled to said plurality of second sub-groups of segmental electrode portions of said second electrode groups for connection of said respective phase-shifted drive signals thereto.

3. A plural digit liquid crystal display device according to claim 2, wherein said means for sequentially applying phase-shifted drive applies said phase-shifted drive signals to respective commonly connected segmental electrode portion sub-groups of all of said second electrode groups at the same time.

4. A plural digit liquid crystal display device according to claim 3, wherein said means for applying segment drive signals applies said segment drive signals to a selected one of said segment electrode sub-groups of a plurality of said first electrode groups in synchronism with and concurrently with said application of a respective phase-shifted drive signal.

5. A plural digit liquid crystal display device according to claim 2, wherein the connections of said first terminals to said plurality of first sub-groups of segment electrodes do not cross said connections between said second terminals and said respective second sub-groups of segmental electrode portions.

6. A plural digit liquid crystal display device according to claim 1, wherein said segments of said first electrode group are vertically divided into respective sub-groups, and said segmental electrode portions of said second electrode groups are horizontally divided into respective sub-groups.

7. A plural digit liquid crystal display device according to claim 1, in which said means for applying said segment drive signals to said segment electrode sub-groups of said first electrode groups comprises:
   decoder means responsive to display data for forming a segment selecting signal;
   a plurality of holding circuits to which the outputs of the decoder means are delivered; and
   a plurality of drivers coupled to said holding circuits adapted to generate segment drive signals in accordance with the outputs of the holding circuits.

8. A plural digit liquid crystal display device according to claim 1, in which said means for applying said segment drive signals to said segment electrode sub-groups of said first electrode groups comprises:
   signal means responsive to display data for forming a representative signal from the display data;
   a segment selecting circuit coupled to said signal means for forming a segment selecting signal from the representative signal of the signal means;
   a plurality of holding circuits to which the outputs of the segment selecting circuit are delivered; and
   a plurality of drivers coupled to said holding circuits adapted to generate segment drive signals in accordance with the outputs of the holding circuits.

9. A plural digit liquid crystal display device according to claim 1, wherein said first electrode groups each comprise seven segment electrodes arranged in a figure 8 pattern.

10. A plural digit liquid crystal display device according to claim 1, wherein each of said digits comprises seven segment electrodes arranged in a figure 8 configuration, each of said first electrode groups comprising a plurality of sub-groups of segment electrodes, each of said sub-groups comprising a plurality of segment electrodes, and each of said second electrode groups comprising a plurality of sub-groups of electrode portions, a plurality of said sub-groups of said second electrode groups comprising a plurality of segmental electrode portions and one of said sub-groups comprising one segmental electrode portion, corresponding electrode sub-groups of each digit being commonly connected together for receiving respective phase-shifted drive signals.

11. A plural digit liquid crystal display device according to claim 10, wherein said first and second electrode groups collectively define a further indicia interposed between said digits, said electrodes and electrode portions defining further indicia being connected to one of said sub-groups of said first and second electrode groups, respectively.

12. A plural digit liquid crystal display device according to claim 1, wherein said second electrode groups are divided into a plurality of sub-groups, the corresponding sub-groups of each of said second groups being commonly connected together.

13. A plural digit liquid crystal display device according to claim 1, wherein each of said first electrode groups comprises a plurality of sub-groups of electrodes, the segment electrodes of said first electrode groups being arranged in a figure 8 configuration.

14. A plural digit liquid crystal display device comprising:
   a plural digit liquid crystal display panel including a liquid crystal;
   a plurality of first electrode groups disposed on one side of said display panel, each of said first electrode groups corresponding to and at least partially defining a respective digit of said plural digit display device and each of said first electrode groups including a plurality of segment electrodes;
   a plurality of second electrode groups disposed on the side of the display panel opposite to the side on which said first electrode group is disposed, each of said second electrode groups corresponding to and at least partially defining a respective digit of said plural digit display and each of said electrode groups including a plurality of segmental electrode portions;
   said electrodes of said first electrode groups being in correspondence with said electrode portions of said second electrode groups;
   each of said first electrode groups being grouped into a plurality of first sub-groups of segment electrodes, said segment electrodes of each first sub-group of segment electrodes being commonly connected together;
   each of said second electrode groups being grouped into a plurality of second sub-groups of segmental electrode portions which are different in configuration from said first sub-groups of segment electrodes, said segmental electrode portions of each second sub-group of segmental electrode portions being commonly connected together and corresponding second sub-groups of electrode portions of each of said second electrode groups for each digit being commonly connected together;
   means for sequentially applying phase-shifted drive signals of a predetermined cycle to the respective commonly connected segmental electrode portion sub-groups of said second electrode groups; and
   means for applying segment drive signals, corresponding to data to be displayed, simultaneously to a selected segment electrode sub-group of selected ones of said first electrode groups in synchronism with and concurrently with said application of a respective phase-shifted drive signal to effect a data display.

15. A plural digit liquid crystal display device comprising:
   a plural digit liquid crystal display panel including a liquid crystal;
   a plurality of first electrode groups disposed on one side of said display panel, each of said first electrode groups corresponding to and at least partially defining a respective digit of said plural digit display device and each of said first electrode groups including a plurality of segment electrodes;
   a plurality of second electrode groups disposed on the side of the display panel opposite to the side on which said first electrode group is disposed, each of said second electrode groups corresponding to and at least partially defining a respective digit of said plural digit display device and each of said electrode groups including a plurality of electrode portion;
   said electrodes of said first electrode groups being in correspondence with said electrode portion of said second electrode groups;
   each of said first electrode groups being grouped into a plurality of first sub-groups of segment electrodes, said segment electrodes of each first sub-group of segment electrodes being commonly connected together;
   each of said second electrode groups being grouped into a plurality of second sub-groups of electrode portions which are different in configuration from said first sub-groups of segment electrodes, said electrode portions of each second sub-groups of electrode portions being commonly connected together and corresponding second sub-groups of electrode portions of each of said second electrode groups for each digit being commonly connected together;
   means for sequentially applying phase-shifted drive signals of a predetermined cycle to the respective commonly connected electrode portion sub-groups of said second electrode groups; and
   means for applying segment drive signals, corresponding to data to be displayed, simultaneously to a selected segment electrode sub-group of selected ones of said first electrode groups in synchronism with and concurrently with said application of a respective phase-shifted drive signal to effect a data display.

16. A plural digit liquid crystal display device comprising:
   a plural digit liquid crystal display panel including a liquid crystal;
   a plurality of first electrode groups disposed on one side of said display panel, each of said first electrode groups corresponding to and at least partially defining a respective digit of said plural digit display device and each of said first electrode groups including a plurality of segment electrodes;
   a plurality of second electrode groups disposed on the side of the display panel opposite to the side on which said first electrode group is disposed, each of said second electrode groups corresponding to and at least partially defining a respective digit of said plural digit display device and each of said second electrode groups including a plurality of segment defining means each for at least partially defining at least one display segment;
   said electrodes of said first electrode groups being in exact correspondence with said segment defining means of said second electrode groups;
   each of said first electrode groups being grouped into a plurality of first sub-groups of segment electrodes, said segment electrodes of each first sub-group of segment electrodes being commonly connected together;
   each of said second electrode groups being grouped into a plurality of second sub-groups of segment defining means which are different in configuration from said first sub-groups of segment electrodes, said segment defining means of each second sub-group of segment defining means being commonly connected together and corresponding second sub-groups of segment defining means of each of said second electrode groups for each digit being commonly connected together;
   means for sequentially applying phase-shifted drive signals of a predetermined cycle to the respective commonly connected segment defining means sub-groups of said second electrode groups; and means for applying segment drive signals, corresponding to data to be displayed, simultaneously to a selected segment electrode sub-group of selected ones of said first electrode groups in synchronism with and concurrently with said application of a respective phase-shifted drive signal to effect a data display.

17. A plural digit liquid crystal display device according to claim 16, wherein said liquid crystal display panel comprises first terminals respectively coupled to said plurality of first sub-groups of segment electrodes of said first electrode groups for connection thereto of said segment drives; and a plurality of second terminals respectively coupled to said plurality of second sub-groups of segment defining means of said second electrode groups for connection of said respective phase-shifted drive signals thereto.

18. A plural digit liquid crystal display device according to claim 17, wherein said means for sequentially applying phase-shifted drive applies said phase-shifted drive signals to respective commonly connected segment defining means sub-groups of all of said second electrode groups at the same time.

19. A plural digit liquid crystal display device according to claim 18, wherein said means for applying segment drive signals applies said segment drive signals to a selected one of said segment electrode sub-groups of a plurality of said first electrode groups in synchronism with and concurrently with said application of a respective phase-shifted drive signal.

20. A plural digit liquid crystal display device according to claim 17, wherein the connections of said first terminals to said plurality of first sub-groups of segment electrodes do not cross said connections between said second terminals and said respective second sub-groups of segment defining means.

21. A plural digit liquid crystal display device according to claim 16, wherein said segments of said first electrode group are vertically divided into respective sub-groups, and said segment defining means of said second electrode groups are horizontally divided into respective sub-groups.

22. A plural digit liquid crystal display device according to claim 16, in which said means for applying said segment drive signals to said segment electrode sub-groups of said first electrode groups comprises:
decoder means responsive to display data for forming a segment selecting signal;
a plurality of holding circuits to which the outputs of the decoder means are delivered; and
a plurality of drivers coupled to said holding circuits adapted to generate segment drive signals in accordance with the outputs of the holding circuits.

23. A plural digit liquid crystal display device according to claim 16, in which said means for applying said segment drive signals to said segment electrode sub-groups of said first electrode groups comprises:
signal means responsive to display data for forming a representative signal from the display data;
a segment selecting circuit coupled to said signal means for forming a segment selecting signal from the representative signal of the signal means;
a plurality of holding circuits to which the outputs of the segment selecting circuit are delivered; and a plurality of drivers coupled to said holding circuits adapted to generate segment drive signals in accordance with the outputs of the holding circuits.

24. A plural digit liquid crystal display device according to claim 16, wherein said first electrode groups each comprise seven segment electrodes arranged in a figure 8 pattern.

25. A plural digit liquid crystal display device according to claim 16, wherein each of said digits comprises seven segment electrodes arranged in a figure 8 configuration, each of said first electrode groups comprising a plurality of sub-groups of segment electrodes, each of said sub-groups comprising a plurality of segment electrodes, and each of said second electrode groups comprising a plurality of sub-groups of segment defining means, a plurality of said sub-groups of said second electrode groups comprising a plurality of segment defining means and one of said sub-groups comprising one segment defining means, corresponding electrode sub-groups of each digit being commonly connected together for receiving respective phase-shifted drive signals.

26. A plural digit liquid crystal display device according to claim 25, wherein said first and second electrode groups collectively define a further indicia interposed between said digits, said electrode defining means defining further indicia being connected to one of said sub-groups of said first and second electrode groups, respectively.

27. A plural digit liquid crystal display device according to claim 16, wherein said second electrode groups are divided into a plurality of sub-groups, the corresponding sub-groups of each of said second groups being commonly connected together.

28. A plural digit liquid crystal display device according to claim 16, wherein each of said first electrode groups comprises a plurality of sub-groups of electrodes, the segment electrodes of said first electrode groups being arranged in a figure 8 configuration.

29. A plural digit liquid crystal display device comprising:
a plural digit liquid crystal display panel including a liquid crystal;
a plurality of first electrode groups disposed on one side of said display panel, each of said first electrode groups corresponding to and at least partially defining a respective digit of said plural digit display device and each of said first electrode groups including a plurality of segment electrodes;
a plurality of second electrode groups disposed on the side of the display panel opposite to the side on which said first electrode group is disposed, each of said second electrode groups corresponding to and at least partially defining a respective digit of said plural digit display and each of said second electrode groups including a plurality of segment defining means each for at least partially defining at least one display segment;
said electrodes of said first electrode groups being in correspondence with said segment defining means of said second electrode groups;
each of said first electrode groups being grouped into a plurality of first sub-groups of segment electrodes, said segment electrodes of each first sub-group of segment electrodes being commonly connected together;
each of said second electrode groups being grouped into a plurality of second sub-groups of segment defining means which are different in configuration from said first sub-groups of segment electrodes, said segment defining means of each second sub-group of segment defining means being commonly connected together and corresponding second sub-groups of segment defining means of each of said second electrode groups for each digit being commonly connected together;

means for sequentially applying phase-shifted drive signals of a predetermined cycle to the respective commonly connected segment defining means sub-groups of said second electrode groups; and means for applying segment drive signals, corresponding to data to be displayed, simultaneously to a selected segment electrode sub-group of selected ones of said first electrode groups in synchronism with and concurrently with said application of a respective phase-shifted drive signal to effect a data display.

* * * * *